US010687048B2

(12) United States Patent
Jin et al.

(10) Patent No.: US 10,687,048 B2
(45) Date of Patent: Jun. 16, 2020

(54) STEREOSCOPIC DISPLAY DEVICE HAVING A BARRIER PANEL

(71) Applicant: LG DISPLAY CO., LTD., Seoul (KR)

(72) Inventors: You-Yong Jin, Seoul (KR); Dong-Yeon Kim, Seoul (KR); Wook Jeon, Daejeon (KR); Hee-Jin Im, Paju-si (KR); Yong-Ku Lee, Gimpo-si (KR); Ju-Hoon Jang, Paju-si (KR); Woon-Chan Moon, Daegu (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/223,076

(22) Filed: Dec. 17, 2018

(65) Prior Publication Data

US 2019/0208185 A1 Jul. 4, 2019

(30) Foreign Application Priority Data

Dec. 29, 2017 (KR) .................. 10-2017-0184364

(51) Int. Cl.
*H04N 13/31* (2018.01)
*G02B 27/22* (2018.01)
(Continued)

(52) U.S. Cl.
CPC ............. *H04N 13/31* (2018.05); *G02B 30/27* (2020.01); *G02F 1/133* (2013.01); *G02F 1/134309* (2013.01); *G02F 1/136286* (2013.01); *G09G 3/003* (2013.01); *H01L 27/3232* (2013.01); *H01L 51/5259* (2013.01); *H04N 13/312* (2018.05); *H04N 13/366* (2018.05); *H04N 13/398* (2018.05); *G02F 1/1347* (2013.01); *G02F 1/13452* (2013.01); *G02F 1/133603* (2013.01); *G02F 2201/44* (2013.01);
(Continued)

(58) Field of Classification Search
CPC .... H04N 13/31; H04N 13/312; H04N 13/366; H04N 13/398; H04N 2213/001; G02B 30/27; G02F 1/133; G02F 1/134309; G02F 1/136286; G02F 1/133603; G02F 1/13452; G02F 1/1347; G02F 2201/44; H01L 27/3232; H01L 27/3244; H01L 51/5259; G09G 2300/0426
USPC .......................................................... 348/58
See application file for complete search history.

(56) References Cited

U.S. PATENT DOCUMENTS

| | | | | |
|---|---|---|---|---|
| 2009/0153653 A1* | 6/2009 | Lee | .................... | G02F 1/13471 348/59 |
| 2012/0206503 A1* | 8/2012 | Hirakata | ................ | H04N 13/31 345/690 |
| 2016/0223827 A1* | 8/2016 | Murao | ................... | H04N 13/31 |

OTHER PUBLICATIONS

Search Report dated Apr. 12, 2019 issued in the corresponding European Patent Application No. 18215830.3, 7 Pages.

* cited by examiner

*Primary Examiner* — Matthew K Kwan
(74) *Attorney, Agent, or Firm* — Polsinelli PC

(57) ABSTRACT

A stereoscopic display device having a barrier panel is provided. The barrier panel may include channel electrodes across an active area. Each of the channel electrodes may include an end portion connected to corresponding link line. Each of the channel electrodes may be connected to the link line same as (n+1)th channel electrode from the channel electrode. The barrier panel may further include connecting lines to connect between opposite end portions of the channel electrode which are connected to the same link line. Thus, in the stereoscopic display device, the number of the wires extending along an edge of the active area may be reduced.

16 Claims, 6 Drawing Sheets

(51) Int. Cl.
    *H01L 27/32*     (2006.01)
    *H01L 51/52*     (2006.01)
    *G02F 1/1362*     (2006.01)
    *G02F 1/1343*     (2006.01)
    *H04N 13/398*     (2018.01)
    *H04N 13/366*     (2018.01)
    *H04N 13/312*     (2018.01)
    *G09G 3/00*     (2006.01)
    *G02F 1/133*     (2006.01)
    *G02B 30/27*     (2020.01)
    *G02F 1/1345*     (2006.01)
    *G02F 1/1347*     (2006.01)
    *G02F 1/13357*     (2006.01)

(52) U.S. Cl.
    CPC .. *G09G 2300/0426* (2013.01); *H01L 27/3244* (2013.01); *H04N 2213/001* (2013.01)

STEREOSCOPIC DISPLAY DEVICE HAVING A BARRIER PANEL

CROSS REFERENCE TO RELATED APPLICATION

This application claims the priority benefit of Korean Patent Application No. 10-2017-0184364, filed on Dec. 29, 2017, which is hereby incorporated in its entirety by reference as if fully set forth herein.

BACKGROUND

Field of the Disclosure

The present disclosure relates to a stereoscopic display device which realizes a stereoscopic image using a barrier panel.

Description of the Background

Generally, a display device includes a display panel which realizes an image. For example, the display device may include a liquid crystal panel having a liquid crystal, and/or an OLED panel having a light-emitting element.

The display device may realize a stereoscopic image using a position difference of viewer's eyes. For example, the display device may be a stereoscopic display device differently providing an image realized by the display panel using the binocular disparity.

The stereoscopic display device may include a barrier panel. The barrier panel may separate the image provided to the left eye and the right eye of the viewer using a path difference of light emitted from the display panel. For example, the barrier panel may form transmitting regions and blocking regions by adjusting voltage applied to channel electrodes which are disposed at regular intervals. The blocking regions may be disposed between the transmitting regions.

The barrier panel may shift a proper viewing range for a stereoscopic image according to a location of the viewer. For example, the barrier panel may move the transmitting regions and the blocking regions according to the location of the viewer, by individually adjusting the voltage applied to each channel electrode. A distance between the channel electrodes may be proportional to the moving distance of the proper viewing range according to the location of the viewer. For example, when the number of the channel electrodes is increased, the movement of the proper viewing range may be smooth. However, when the number of the channel electrodes is increased, the number of link lines which supplies signal to the channel electrodes may be increased. Each of the channel electrodes may form a closed loop with the corresponding link line in order to prevent a luminance variation due to a voltage drop. Thus, in the stereoscopic display device, when the number of the link lines is increased, a size of a peripheral area disposed outside the active area may be increased, so that the overall size of the barrier panel may be increased.

SUMMARY

Accordingly, the present disclosure is directed to a stereoscopic display device that substantially obviates one or more problems due to limitations and disadvantages of the related art.

An object of the present disclosure is to provide a stereoscopic display device in which the number of channel electrodes may be increased, and a size of a peripheral area may be minimized.

More specifically, the present disclosure is to provide a stereoscopic display device in which a voltage drop of each channel electrode is prevented, and a size of a peripheral area in which link lines are disposed is reduced.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a stereoscopic display device including a display panel. The display panel is driven by a display driver. A barrier panel is disposed on the display panel. The barrier panel includes channel electrodes, link lines and connecting lines. The channel electrodes cross an active area. The link lines are connected to an end portion of each channel electrode. The channel electrodes are divided into a plurality of groups, and channel electrodes at corresponding locations in each group are connected to a same link line. Each of the connecting lines connects between opposite end portions of the channel electrodes which are connected to the same link line. A barrier driver controls the channel electrodes through the corresponding link line.

The number of the link lines in which each channel electrode crosses may be inversely proportional to the number of the connecting lines in which the channel electrode crosses.

The sum of the number of the link lines in which each channel electrode crosses and the number of the connecting lines in which the channel electrode crosses may be the same.

The active area may be disposed between the link lines and the connecting lines.

The barrier panel may further include trigger electrodes and trigger lines. The trigger electrodes may be disposed between the channel electrodes. The trigger lines may connect an end portion of each trigger electrode to the barrier driver. The trigger electrodes may be extended along an edge of the active area.

Each of the trigger electrodes may cross n connecting lines, wherein n is a number of the connecting lines.

An opposite end portion of each trigger electrode may be disposed in the active area.

The location of a viewer may be detected by a viewing location detecting unit. The barrier driver may adjust a signal applied to the channel electrodes according to a signal of the viewing location detecting unit.

The display panel may include a first display substrate, a second display substrate and a light-emitting element between the first display substrate and the second display substrate.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
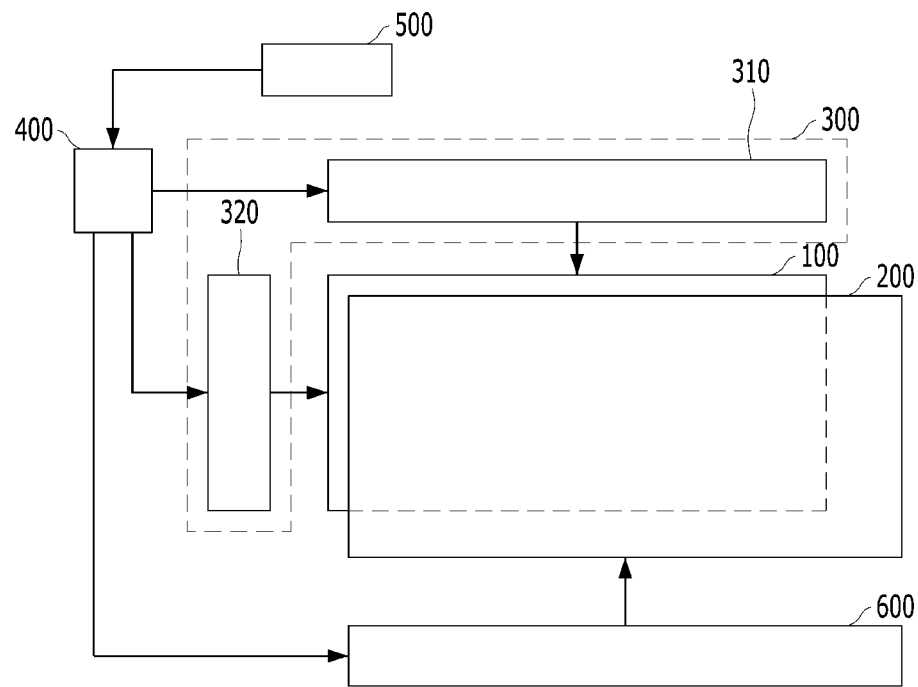
FIG. 1 is a view schematically showing a stereoscopic display device according to an aspect of the present disclosure.

Hereinafter, details related to the above technical configurations, and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

(Aspect)

Figure 2A:
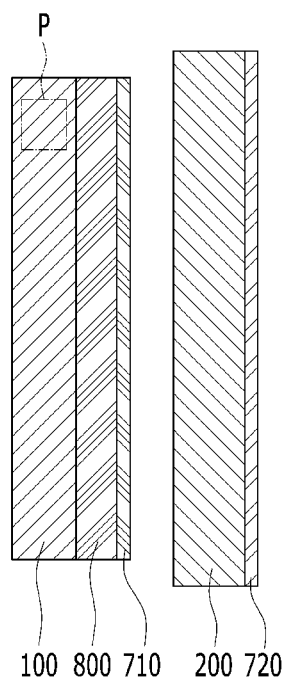
FIG. 2A is a view showing a display panel and a barrier panel of the stereoscopic display device according to the aspect of the present disclosure.
Figure 2B:
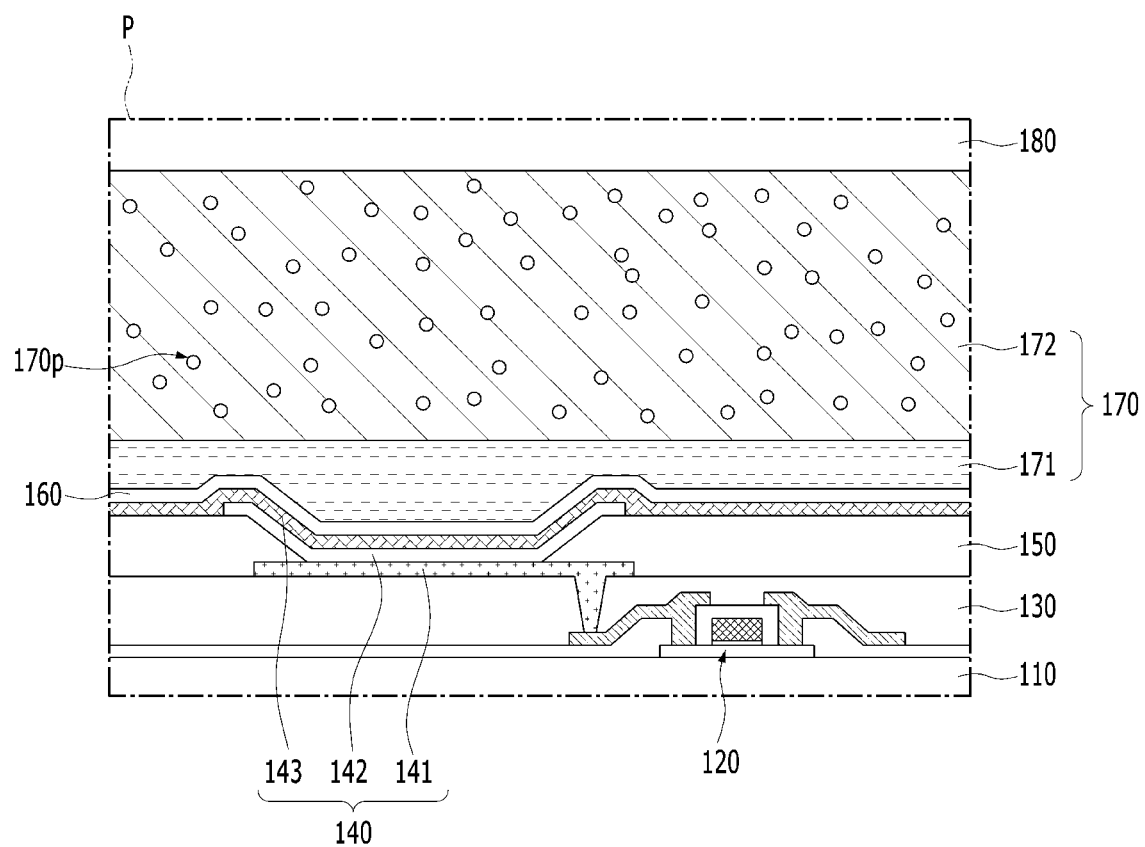
FIG. 2B is an enlarged view of P region in FIG. 2A.

FIG. 1 is a view schematically showing a stereoscopic display device according to an aspect of the present disclosure. FIG. 2A is a view showing a display panel and a barrier panel of the stereoscopic display device according to the aspect of the present disclosure. FIG. 2B is an enlarged view of P region in FIG. 2A.

Referring FIGS. 1, 2A and 2B, the stereoscopic display device according to the aspect of the present disclosure may include a display panel 100, a barrier panel 200, a display driver 300, a timing controller 400, a viewing location detecting unit 500 and a barrier driver 600.

The display panel 100 may realize an image which is provided to a viewer. For example, the display panel 100 may include a light-emitting element 140 between a first display substrate 110 and a second display substrate 180. The light-emitting element 140 may generate light displaying a specific color to realize the image. For example, the light-emitting element 140 may include a first emission element 141, a light-emitting layer 142 and a second emission element 143, which are sequentially stacked on the first display substrate 110. The light-emitting layer 142 may include an organic emission material or an inorganic emission material. For example, the display panel 100 of the stereoscopic display device according to the aspect of the present disclosure may be an OLED panel including an organic light-emitting element.

The display panel 100 may further include a thin film transistor 120 between the first display substrate 110 and the light-emitting element 140, an over-coat layer 130 covering the thin film transistor 120, and a bank insulating layer 150 covering an edge of the first emission element 141. The over-coat layer 130 may remove a thickness difference due to the thin film transistor 120. The light-emitting element 140 may be disposed on the over-coat layer 130. For example, the over-coat layer 130 may include a contact hole exposing drain electrode of the thin film transistor 120.

The display panel 100 may further include an upper passivation layer 160 and an adhesive layer 170 which are disposed between the light-emitting element 140 and the second display substrate 180. The upper passivation layer 160 may prevent the damage of the light-emitting element 140 due to the external impact and moisture. The adhesive layer 170 may be disposed between the upper passivation layer 160 and the second display substrate 180. The second display substrate 180 may be coupled to the first display substrate 110 in which the upper passivation layer 160 is formed, by the adhesive layer 170. The adhesive layer 170 may have a multi-layer structure. For example, the adhesive layer 170 may include a lower adhesive layer 171 and an upper adhesive layer 172. The upper adhesive layer 172 may be disposed between the lower adhesive layer 171 and the second display substrate 180. The upper adhesive layer 172 may include a moisture-absorbing material 170$p$. The lower adhesive layer 171 may relieve the stress applied to the light-emitting element 140 due to the expansion of the moisture-absorbing material 170$p$.

The barrier panel 200 may be disposed on the display panel 100. The barrier panel 200 may separate the image realized by the display panel 100 to provide the left eye and the right eye of the viewer. For example, the image realized by the display panel 100 may be stereoscopically recognized to the viewer by the barrier panel 200.

Figure 3A:
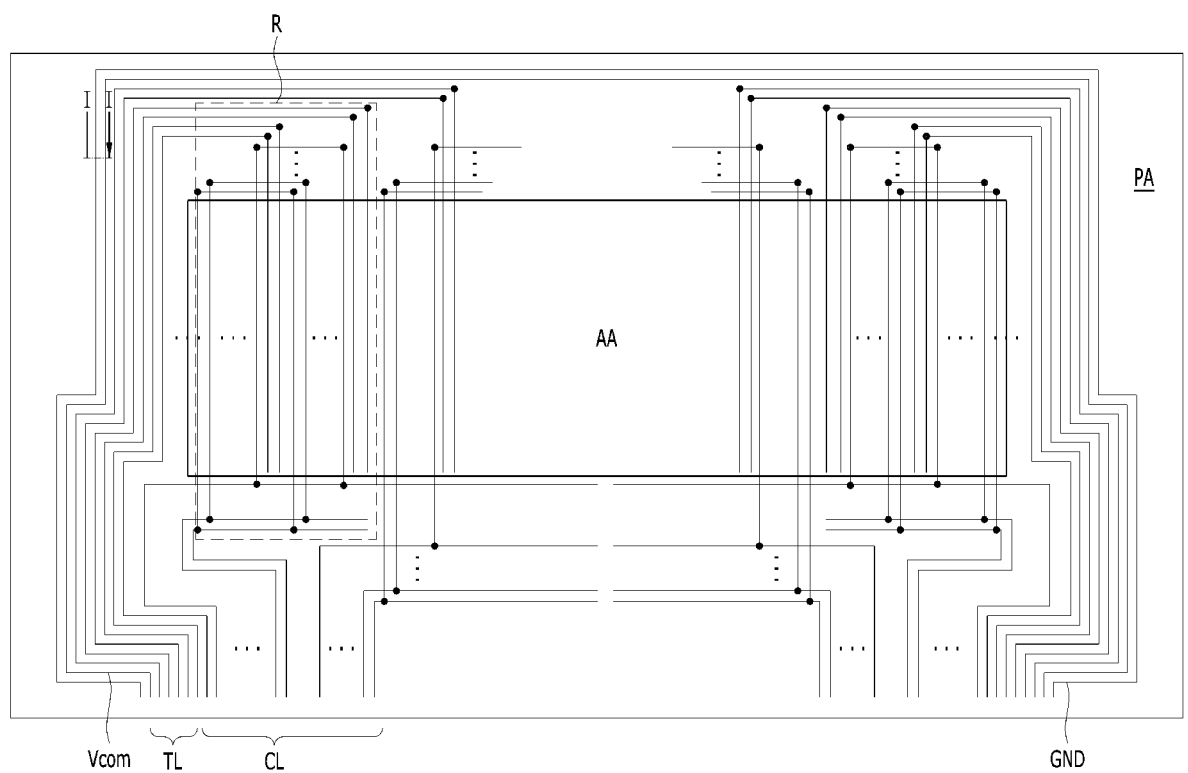
FIG. 3A is a view schematically showing wiring lines in the barrier panel of the stereoscopic display device according to the aspect of the present disclosure.
Figure 3B:
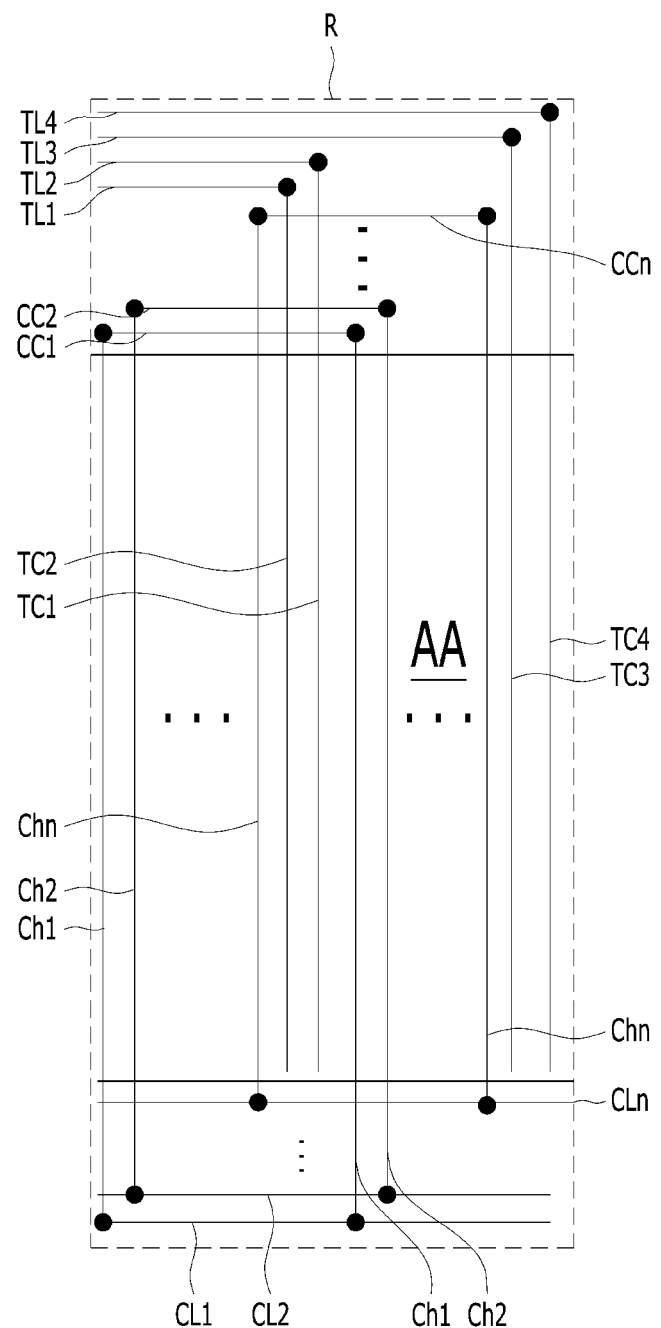
FIG. 3B is an enlarged view of R region in FIG. 3A.
Figure 3C:
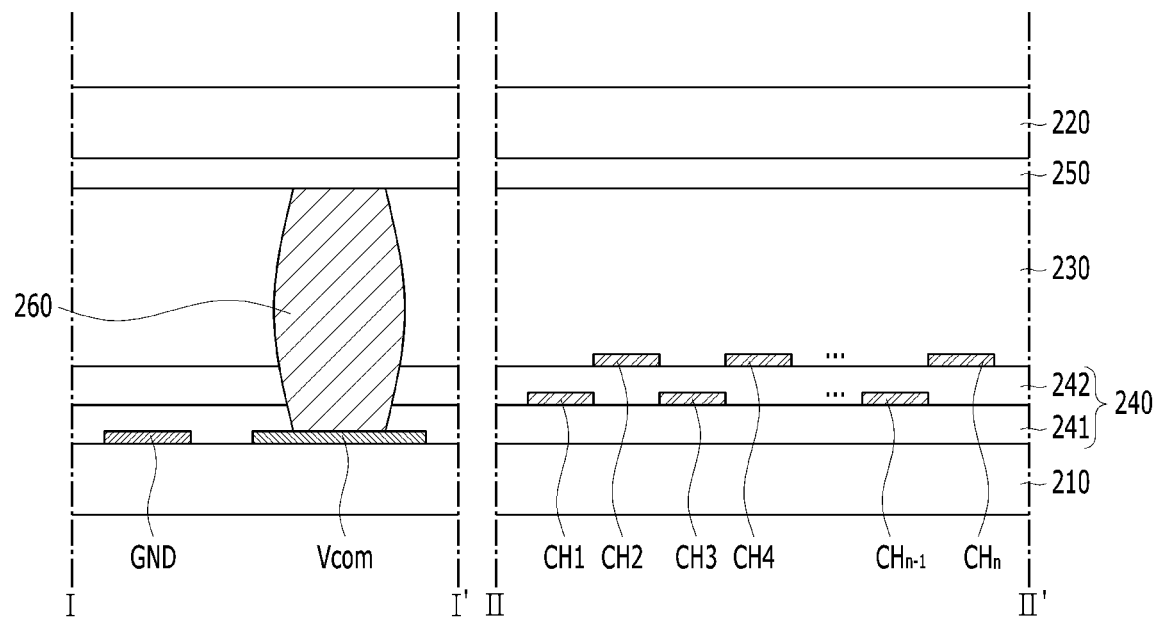
FIG. 3C is a view taken along I-I' of FIG. 3A and II-II' of FIG. 3B.

FIG. 3A is a view schematically showing a wiring lines on the barrier panel 200 of the stereoscopic display device according to the aspect of the present disclosure. FIG. 3B is an enlarged view of R region in FIG. 3A. FIG. 3C is a view taken along I-I' of FIG. 3A and II-II' of FIG. 3B.

Referring FIGS. 1, 2A and 3A to 3C, the barrier panel 200 of the stereoscopic display device according to the aspect of the present disclosure may include a first barrier substrate 210, a second barrier substrate 220, a liquid crystal layer 230, channel electrodes CH1-CHn, a barrier insulating layer 240, a common electrode 250, link lines CL1-CLn, and connecting lines CC1-CCn.

The first barrier substrate 210 and the second barrier substrate 220 may include an insulating material. The first barrier substrate 210 and the second barrier substrate 220 may include a transparent material. For example, the first barrier substrate 210 and the second barrier substrate 220 may include glass.

The liquid crystal layer 230 may be disposed between the first barrier substrate 210 and the second barrier substrate 220. The liquid crystal layer 230 may include a liquid crystal rotated by an electric field which applied to the outside. For example, the liquid crystal in the liquid crystal layer 230 may be TN type or ECB type.

The channel electrodes CH1-CHn may be disposed between the first barrier substrate 210 and the liquid crystal layer 230. The channel electrodes may be disposed at regular intervals. For example, the channel electrodes CH1-CHn may be a multi-layer structure separated by the barrier insulating layer 240. The barrier insulating layer 240 may include an insulating material. For example, the barrier insulating layer 240 may include silicon oxide or silicon nitride.

The barrier panel 200 may selectively transmit or block light. For example, the barrier panel 200 may include an active area in which transmitting regions and blocking regions may be formed by the channel electrodes CH1-CHn. The channel electrode CH1-CHn may cross the active area AA, completely. For example, end portions of the channel electrodes CH1-CHn may be disposed outside the active area AA. The channel electrodes CH1-CHn may include a conductive material. The channel electrodes CH1-CHn may include a transparent material. For example, the channel electrodes CH1-CHn may be formed of ITO or IZO.

The transmitting regions and the blocking regions may be repeated at regular intervals. For example, n channel electrodes CH1-CHn may be repeatedly arranged in the active area AA. In other words, a plurality of groups of channel electrodes may be repeatedly arranged in the active area AA, wherein each group includes n channel electrodes CH1-CHn. A signal applied to each the channel electrode CH1-CHn may be the same as a signal applied to the (n+1)th channel electrode CH1-CHn from the corresponding channel electrode CH1-CHn. That is, a signal applied to CH1 in each group may be the same, a signal applied to CH2 in each group may be the same, . . . , a signal applied to CHn in each group may be the same.

The common electrode 250 may be disposed between the liquid crystal layer 230 and the second barrier substrate 220. For example, the common electrode 250 may be formed on a surface of the second barrier substrate 220 facing the first barrier substrate 210. The common electrode 250 may form a vertical electric field with the channel electrodes CH1-CHn. The liquid crystal in the liquid crystal layer 230 may be rotated according to the vertical electric field formed between the channel electrodes CH1-CHn and the common electrode 250. The common electrode 250 may be extended along the surface of the second barrier substrate 220. For example, the transmitting regions and the blocking regions may be formed by the rotation of the liquid crystal according to signal applied to the corresponding channel electrode CH1-CHn.

The common electrode 250 may include a conductive material. The common electrode 250 may include a transparent material. For example, the common electrode 250 may be formed of ITO or IZO.

The link lines CL1-CLn may be disposed on a peripheral area PA which is disposed outside the active area AA. The link lines CL1-CLn may be connected to the channel electrode CH1-CHn. Each of the channel electrodes CH1-CHn may be connected to the barrier driver 600 through one of the link lines CL1-CLn. For example, each of the channel electrodes CH1-CHn may include an end portion connected to the barrier driver 600 through the corresponding link line CL1-CLn.

The link lines CL1-CLn may be disposed on a side of the active area AA. The link lines CL1-CLn may be not extended along an edge of the active area AA. That is, the link lines CL1-CLn may be not extended toward opposite end portions of the channel electrodes CH1-CHn. Thus, in the stereoscopic display device according to the aspect of the present disclosure, a size of the peripheral area PA in which the link lines CL1-CLn is disposed may be minimized. Therefore, in the stereoscopic display device according to the aspect of the present disclosure, a size of the active area AA in which the transmitting regions and the blocking regions are formed by the channel electrodes CH1-CHn may be relatively increased. That is, in the stereoscopic display device according to the aspect of the present disclosure, the movement of the transmitting regions and the blocking regions according to the location of the viewer may be efficiently performed.

The link lines CL1-CLn may cross the channel electrodes CH1-CHn. The number of the link lines CL1-CLn in which each channel electrode CH1-CHn crosses may be different from each other. The channel electrodes CH1-CHn in which the same signal is applied may be connected to the same link line CL1-CLn. For example, an end portion of each channel electrode CH1-CHn may be connected to the link line CL1-CLn same as an end portion of (n+1)th channel electrode CH1-CHn from the corresponding channel electrode CH1-CHn. That is, an end portion of CH1 in each group may be connected to a same link line, an end portion of CH2 in each group may be connected to a same link line, . . . , an end portion of CHn in each group may be connected to a same link line. The number of the link lines CL1-CLn crossed by the channel electrodes CH1-CHn which are connected to the same link line CL1-CLn may be the same.

The link lines CL1-CLn may include a conductive material. The link lines CL1-CLn may be a material having a relatively high conductivity. For example, the link lines CL1-CLn may include a metal, such as aluminum (Al).

The connecting lines CC1-CCn may be connected to opposite end portions of the channel electrodes CH1-CHn. For example, the active area AA may be disposed between the link lines CL1-CLn and the connecting lines CC1-CCn. Opposite end portions of the channel electrodes CH1-CHn which are connected to the same link line CL1-CLn may be connected to the same connecting line CC1-CCn. For example, an opposite end portion of each channel electrode CH1-CHn may be connected to the connecting line CC1-CCn same as an opposite end portion of (n+1)th channel electrode CH1-CHn from the corresponding channel electrode CH1-CHn. That is, an opposite end portion of CH1 in each group may be connected to a same connecting line, an opposite end portion of CH2 in each group may be connected to a same connecting line, . . . , an opposite end portion of CHn in each group may be connected to a same connecting line. Thus, in the stereoscopic display device according to the aspect of the present disclosure, each of the channel electrodes CH1-CHn may form a closed loop with the corresponding link line CL1-CLn, the corresponding connecting line CC1-CCn and (n+1)th channel electrode CH1-CHn from the corresponding channel electrode CH1-CHn. Therefore, the stereoscopic display device according to the aspect of the present disclosure may prevent the luminance variation due to voltage drop in the channel electrodes CH1-CHn.

The connecting lines CC1-CCn may include a conductive material. The connecting lines CC1-CCn may include a material have relatively high conductivity. For example, the connecting lines CC1-CCn may include a metal, such as aluminum (Al). The connecting line CC1-CCn may include a material same as the link lines CL1-CLn.

The number of the connecting lines CC1-CCn in which each channel electrode CH1-CHn crosses may be different. For example, the number of the connecting lines CC1-CCn crossed by each channel electrode CH1-CHn may be inversely proportional to the number of the link lines CL1-CLn crossed by the corresponding channel electrode CH1-CHn. The sum of the number of the connecting lines CC1-CCn crossed by each channel electrode and the number of the link lines CL1-CLn crossed by the corresponding channel electrode CH1-CHn may be constant. Thus, the stereoscopic display device according to the aspect of the present disclosure may prevent the variation of the load applied to the channel electrodes CH1-CHn. Therefore, in the stereoscopic display device according to the aspect of the present disclosure, the dim line generated by the variation of the load applied to the channel electrodes CH1-CHn may be prevented.

The barrier panel 200 of the stereoscopic display device according to the aspect of the present disclosure may further include trigger electrodes TC1-TC4 in order to prevent the generation of bright line or dark line due to the movement of the transmitting regions and the blocking regions. The trigger electrodes TC1-TC4 may be disposed between the repeated channel electrodes CH1-CHn. For example, the trigger electrodes TC1-TC4 may be disposed between CHn of one group of channel electrodes and CH1 of next group of channel electrodes. The trigger electrodes TC1-TC4 may cross the active area AA.

The barrier panel 200 may further include trigger lines TL1-TL4 connected to the trigger electrodes TC1-TC4. The trigger electrodes TC1-TC4 may be connected to the trigger lines TL1-TL4, individually. For example, each of the trigger lines TL1-TL4 may be connected to an end portion of the corresponding trigger electrode TC1-TC4. The trigger lines TL1-TL4 may be extended along an edge of the active area AA. For example, the connecting lines CC1-CCn may be disposed between the active area AA and the trigger lines TL1-TL4. Each of the trigger electrodes TC1-TC4 may cross n connecting lines CC1-CCn. Thus, in the stereoscopic display device according to the aspect of the present disclosure, a space for the location of the link lines CL1-CLn may be sufficiently secured, and the luminance variation due to the voltage drop in each channel electrode CH1-CHn may be prevented.

An opposite end portion of each trigger electrode TC1-TC4 may be disposed inside the active area AA. Thus, in the stereoscopic display device according to the aspect of the present disclosure, the trigger electrode TC1-TC4 may not intersect the link lines CL1-CLn. That is, in the stereoscopic display device according to the aspect of the present disclosure, the load applied to the trigger electrodes TC1-TC4 may be the same as the load applied to the channel electrodes CH1-CHn. Therefore, in the stereoscopic display device according to the aspect of the present disclosure, the generation of the dim line due to the load variation between the channel electrodes CH1-CHn and the trigger electrodes TC1-TC4 which cross the active area AA may be prevented.

The barrier panel 200 of the stereoscopic display device according to the aspect of the present disclosure may further include a common voltage supply line Vcom and a ground line GND which are disposed on the peripheral area PA. The common voltage supply line Vcom and the ground line GND may be disposed outside the link lines CL1-CLn and the trigger lines TL1-TL4. For example, the common voltage supply line Vcom may be disposed between the ground line GND and the trigger lines TL1-TL4.

The common voltage supply line Vcom and the ground line GND may include a material different from the channel electrodes CH1-CHn. For example, the common voltage supply line Vcom and the ground line GND may include a metal. The common voltage supply line Vcom and the ground line GND may include a material same as the link lines CL1-CLn and the connecting lines CC1-CCn.

The barrier panel 200 of the stereoscopic display device according to the aspect of the present disclosure may further include a barrier buffer layer 241 which covers the link lines CL1-CLn, the common voltage supply line Vcom, and the ground line GND, and is extended between the first substrate 210 and the channel electrodes CH1-CHn. The barrier buffer layer 241 may include an insulating material. For example, the barrier buffer layer 241 may be silicon oxide.

The common voltage supply line Vcom may be connected to the common electrode 250. For example, in the barrier panel 200 of the stereoscopic display device according to the aspect of the present disclosure, a sealing member 260 for sealing the liquid crystal layer 230 may include a conductive material. The sealing member 260 may be in direct contact with the common electrode 250 and the common voltage supply line Vcom. The common electrode 250 may be connected to the common voltage supply line Vcom by the sealing member 260.

The display driver 300 may drive the display panel 100. The display panel 100 may receive signals for realizing the image from the display driver 300. For example, the display driver 300 may include a data driver 310 and a scan driver 320.

The data driver 310 may provide a data signal to the display panel 100. The scan driver 320 may sequentially apply a scan signal to the display panel 100. The data signal provided by the data driver 310 may be synchronized with the scan signal applied from the scan driver 320.

The timing controller 400 may provide a signal for the operation of the display driver 300. For example, the timing controller 400 may provide digital video data and source timing control signal to the data driver 310. The scan driver 320 may receive clock signals, reset clock signals and start signals from the timing controller 400.

The viewing location detecting unit 500 may detect the location of the viewer. For example, the viewing location detecting unit 500 may detect the position information of the viewer viewing the image realized by the display panel 100 and the barrier panel 200. The viewing location detecting unit 500 may include a camera.

The barrier driver 600 may drive the barrier panel 200. For example, the barrier driver 600 may apply a voltage the channel electrode CH1-CHn through the link lines CL1-

CLn, individually. The barrier driver 600 may control the channel electrodes CH1-CHn of the barrier panel 200 according to the location of the viewer. For example, the barrier driver 600 may adjust the signal applied to the link lines CL1-CLn which are individually connected to channel electrodes CH1-CHn according to the signal of the viewing location detecting unit 500.

A front linear polarizer 710 may be disposed on a surface of the barrier panel 200 facing the display panel 100. A rear linear polarizer 720 may be disposed on a surface of the barrier panel 200 opposite to the front linear polarizer 710. The rear linear polarizer 720 may have a transmission axis perpendicular to the front linear polarizer 710. Thus, in the stereoscopic display device according to the aspect of the present disclosure, the selective transmission and/or blocking of the light may be efficiently performed by the barrier panel 200.

Accordingly, in the stereoscopic display device according to the aspect of the present disclosure, a size for the link lines CL1-CLn in the peripheral area PA may be reduced, so that a size of the active area AA in which the channel electrodes CH1-CHn is disposed may be increased. Also, the stereoscopic display device according to the aspect of the present disclosure may prevent the variation of the load applied to each channel electrode CH1-CHn and the luminance variation due to voltage drop using the link lines CL1-CLn and the connecting lines CC1-CCn in which the active area AA is disposed between the link lines CL1-CLn and the connecting lines CC1-CCn. Thus, in the stereoscopic display device according to the aspect of the present disclosure, the process efficiency and the quality of the image may be improved.

The stereoscopic display device according to the aspect of the present disclosure may include a structure for preventing the reflection of the external light. For example, the stereoscopic display device according to the aspect of the present disclosure may further include a quarter-wave plate 800 between the display panel 100 and a front linear polarizer 710, as shown in FIG. 2A. The quarter-wave plate 800 may be in direct contact with the display panel 100 and the front linear polarizer 710. The barrier panel 200 may be spaced away from the front linear polarizer 710.

Figure 4:
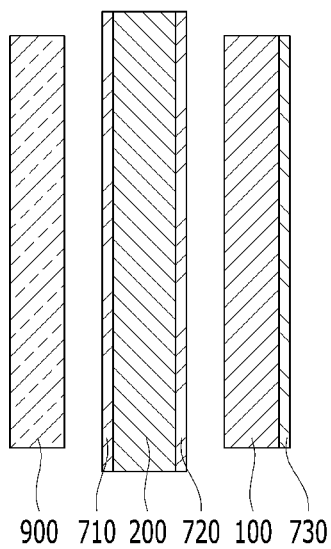
FIGS. 4 and 5 are views respectively showing the display device according to another aspect of the present disclosure.

The stereoscopic display device according to the aspect of the present disclosure is described that the barrier panel 200 is disposed on the display panel 100 including the light-emitting element 140. However, in the stereoscopic display device according to another aspect of the present disclosure, the barrier panel 200 may be disposed between the display panel 100 and the light-emitting element 900, as shown in FIG. 4. For example, the display panel 100 of the stereoscopic display device according to another aspect of the present disclosure may be a liquid crystal panel. The light-emitting element 900 may function as a backlight unit. A front linear polarizer 710 may be disposed between the light-emitting element 900 and the barrier panel 200. A rear linear polarizer 720 may be disposed between the barrier panel 200 and the display panel 100. The front linear polarizer 710 and the rear linear polarizer 720 may be in direct contact with the barrier panel 200. An image linear polarizer 730 may be disposed on an outer surface of the display panel 100. Thus, in the stereoscopic display device according to another aspect of the present disclosure, the proper viewing range for the stereoscopic image may be smoothly moved according to the location of the viewer regardless of the relative position of the display panel 100 and the barrier panel 200.

Figure 5:
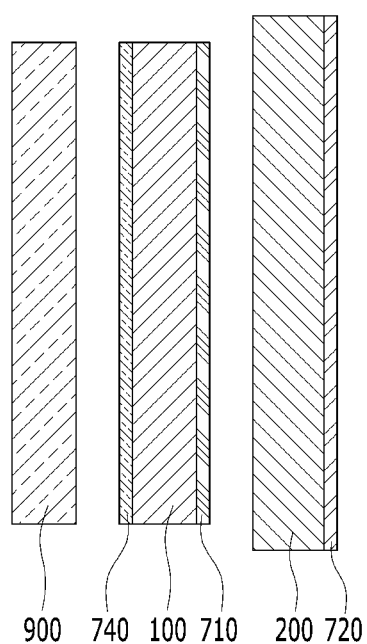

The stereoscopic display device according to another aspect of the present disclosure is described that the barrier panel 200 is disposed between the light-emitting element 900 and the display panel 100. However, in the stereoscopic display device according to further another aspect of the present disclosure, the display panel 100 may be disposed between the light-emitting element 900 and the barrier panel 200, as shown in FIG. 5. The front linear polarizer 710 may be disposed on a surface of the barrier panel 200 facing the display panel 100. The rear linear polarizer 720 may be disposed on a surface of the barrier panel 200 opposite to the front linear polarizer 710. A display linear polarizer 740 may be disposed on a surface of the display panel 100 facing the light-emitting element 900. The display linear polarizer 740 and the front linear polarizer 710 may be in direct contact with the display panel 100. Thus, the stereoscopic display device according to further another aspect of the present disclosure may smoothly provide the stereoscopic image to the moving viewer in the display panel 100 and the barrier panel 200 at various positions.

In the result, the stereoscopic display device according to the aspects of the present disclosure may include a closed loop formed by the channel electrodes connected the same link line by the connecting line. Thus, in the stereoscopic display device according to the aspects of the present disclosure, the link lines may be not extended along the edge of the active area. That is, in the stereoscopic display device according to the aspects of the present disclosure, the size of the peripheral area may be reduced, and the size of the active area may be enlarged. Therefore, in the stereoscopic display device according to the aspects of the present disclosure, the proper viewing range may be smoothly moved according to the location of the viewer, so that the quality of the stereoscopic image may be increased.

What is claimed is:

1. A stereoscopic display device comprising:
a display driver driving a display panel;
a barrier panel on the display panel, wherein the barrier panel includes channel electrodes across an active area and link lines connected to an end portion of each channel electrode; and
a barrier driver controlling the channel electrodes by the link lines,
wherein the channel electrodes are grouped into a plurality of groups, and the channel electrodes at corresponding locations in each of the plurality groups are connected to a same link line, and
wherein the barrier panel further includes connecting lines to connect between opposite end portions of the channel electrodes which are connected to the same link line wherein the number of the link lines in which each channel electrode crosses is inversely proportional to the number of the connecting lines in which the channel electrode crosses.

2. The stereoscopic display device according to claim 1, wherein the sum of the number of the link lines in which each channel electrode crosses and the number of the connecting lines in which the channel electrode crosses is the same.

3. The stereoscopic display device according to claim 1, wherein the active area is disposed between the link lines and the connecting lines.

4. The stereoscopic display device according to claim 1, wherein the barrier panel further includes trigger electrodes disposed between the channel electrodes and trigger lines connecting an end portion of each trigger electrode to the barrier driver, and wherein the trigger electrodes are extended along an edge of the active area.

5. The stereoscopic display device according to claim 4, wherein each of the trigger electrodes crosses n connecting lines, wherein n is the number of the connecting lines.

6. The stereoscopic display device according to claim 4, wherein an opposite end portion of each trigger electrode is disposed in the active area.

7. The stereoscopic display device according to claim 1, further comprising a viewing location detecting unit detecting a location of a viewer,
wherein the barrier driver adjusts a signal applied to the channel electrodes according to a signal of the viewing location detecting unit.

8. The stereoscopic display device according to claim 1, wherein the display panel includes a first display substrate, a second display substrate and a light-emitting element between the first display substrate and the second display substrate.

9. A stereoscopic display device comprising:
a display driver driving a display panel having an active area;
a plurality of channel electrodes disposed at the active area;
a barrier panel forming a transmitting region and a blocking region by adjusting a voltage applied to the plurality of channel electrodes disposed at a constant interval and moving the transmitting region and the blocking region according to a location of a viewer, by individually adjusting the voltage applied to each channel electrode;
a plurality of link lines connected to an end portion of each channel electrode;
a barrier driver controlling the plurality of channel electrodes through the plurality of link lines; and
a plurality of connecting lines disposed on the barrier panel and connecting between opposite end portions of the channel electrodes which are connected to a same link line,
wherein the plurality of channel electrodes is grouped into a plurality of groups, and the plurality of channel electrodes at corresponding locations in each of the plurality groups are connected to the same link line wherein the number of the link lines in which each channel electrode crosses is inversely proportional to the number of the connecting lines in which the channel electrode crosses.

10. The stereoscopic display device according to claim 9, wherein the sum of the number of the link lines in which each channel electrode crosses and the number of the connecting lines in which the channel electrode crosses is the same.

11. The stereoscopic display device according to claim 9, wherein the active area is disposed between the link lines and the connecting lines.

12. The stereoscopic display device according to claim 9, wherein the barrier panel further includes trigger electrodes disposed between the channel electrodes and trigger lines connecting an end portion of each trigger electrode to the barrier driver, and
wherein the trigger electrodes are extended along an edge of the active area.

13. The stereoscopic display device according to claim 12, wherein each of the trigger electrodes crosses n connecting lines, wherein n is the number of the connecting lines.

14. The stereoscopic display device according to claim 12, wherein an opposite end portion of each trigger electrode is disposed in the active area.

15. The stereoscopic display device according to claim 9, further comprising a viewing location detecting unit detecting a location of a viewer, wherein the barrier driver adjusts a signal applied to the plurality of channel electrodes according to a signal of the viewing location detecting unit.

16. The stereoscopic display device according to claim 9, wherein the display panel includes a first display substrate, a second display substrate and a light-emitting element between the first display substrate and the second display substrate.

* * * * *